United States Patent
Wilson

[11] Patent Number: 6,150,945
[45] Date of Patent: Nov. 21, 2000

[54] STATIC CHARGE WARNING DEVICE

[75] Inventor: Robert W. Wilson, Austin, Tex.

[73] Assignee: 3M Innovative Properties Company, St. Paul, Minn.

[21] Appl. No.: 09/276,627

[22] Filed: Mar. 25, 1999

[51] Int. Cl.$^7$ .................................................. G08B 21/00
[52] U.S. Cl. .................... 340/661; 340/649; 340/660; 361/212; 361/220; 324/457
[58] Field of Search .................... 340/661, 660, 340/657, 649, 635, 636; 361/212, 220, 222; 324/457

[56] References Cited

U.S. PATENT DOCUMENTS

| | | | |
|---|---|---|---|
| 3,878,459 | 4/1975 | Hanna | 324/51 |
| 4,398,277 | 8/1983 | Christiansen et al. | 361/220 |
| 4,562,429 | 12/1985 | Conway et al. | 340/657 |
| 4,639,825 | 1/1987 | Breidegam | 361/212 |
| 4,714,915 | 12/1987 | Hascal et al. | 340/657 |
| 4,818,072 | 4/1989 | Mohebban | 350/336 |
| 5,057,965 | 10/1991 | Wilson | 361/212 |
| 5,359,319 | 10/1994 | Campbell et al. | 340/649 |
| 5,457,596 | 10/1995 | Yang | 361/220 |
| 5,461,369 | 10/1995 | Campbell et al. | 340/649 |

*Primary Examiner*—Julie Lieu
*Attorney, Agent, or Firm*—Matthew B. McNutt

[57] ABSTRACT

A wearable device for alerting a user when a static electrical charge has developed on the user which exceeds a preset limit, prior to an accidental discharge of the static charge. The device includes a first conductive element in close proximity to the user and a second conductive element spaced a further distance from the user than the first conductive element. A high impedance differential amplifier provides a voltage signal proportional to the potential difference existing between the first and second conductive elements. A voltage level discriminator receives the voltage signal from the high impedance differential amplifier and triggers an alarm if the voltage signal exceeds a predetermined limit.

11 Claims, 5 Drawing Sheets

STATIC CHARGE WARNING DEVICE

FIELD OF THE INVENTION

The present invention relates to sensing equipment used to detect the presence and build-up of static electrical charges during, for example, the manufacture, maintenance or repair of electronic assemblies. In particular, the invention relates to a personal monitoring device for sensing the buildup of an electrical charge on a person working on sensitive electronic assemblies and warning the wearer prior to discharge of the electrical charge.

BACKGROUND OF THE INVENTION

It is well known that static electrical charge generation in close proximity to electronic assemblies may cause damage when the charge is dissipated through the sensitive electronic components that are typically included in an electronic assembly. The problem of electrostatic discharge (ESD) is frequently encountered during the manufacture, maintenance or repair of electronic assemblies when humans are handling the electronic assemblies. Specifically, the human body tends to generate a static electrical charge through a process known as tribocharging. Tribocharging is a phenomenon that results in the gradual accumulation of a static electrical charge on a body, including a human body, after frictional contact with other surfaces. Providing a means to alert an individual of the presence or build-up of a static electrical charge on that individual's body may prevent an accidental or uncontrolled ESD, and may also thus avoid damage to sensitive electronic equipment.

As electronic assemblies continue to be developed with components having increasing sensitivity and population density, the danger of experiencing component damage caused by ESD increases, even with low levels of static discharge. It is thus becoming more and more important to prevent unwanted ESD. Preventing such damage during the manufacture and handling of sensitive electronic assemblies requires that an environment be provided which is essentially free of static electrical charge.

To avoid the generation of static electrical charge in the workplace environment, consideration must be given to the phenomenon of tribocharging described above. A variety of methods may be used to detect and/or remove static charge from tribocharged bodies. One common method for removing static charge from individual workers is an electrically conducting tether connecting the charged body to electrical ground. Typically, the tether is connected between a device such as a conductive wrist band, which makes intimate contact with the individual's skin, and a predetermined electrical ground site. Static electrical charge that an individual worker develops will leak to electrical ground through the wrist band and conductive tether, thereby removing the static electrical charges to provide a safe environment. For example, U.S. Pat. No. 4,398,277 shows a grounding tether, which may also be described as a grounding cord or cable or strap.

While conductive tethers or grounding cords provide effective removal of static electrical charge, they also have the problem of limiting the range of movement of workers who are grounded for safety. They may also interfere with the work the individual is performing. Grounding methods that permit greater freedom of movement have thus also been developed and include special conductive footwear and heel grounders that are be used in combination with conductive flooring.

It is desirable to be able to monitor the effectiveness of various grounding methods. For example, effective operation of passive grounding cords, as previously described, requires intimate electrical contact between the tether and the body where the static electrical charge exists. Any disruption of electrical contact prevents the static electrical charge from being conducted to ground. This possibility of disruption necessitates provision of a means to determine the efficacy of the grounding cord, using a suitable form of monitor. Currently, devices are available that continually monitor any breaks in the grounding circuit. U.S. Pat. Nos. 4,639,825 and 5,057,965, for example, show open circuit monitors that provide an audible warning when the grounding tether ceases to produce a path to ground. These open circuit monitors function only when a tribocharged body is continuously attached to ground. Therefor, other grounding means, including conductive footwear and heel grounders as mentioned above, cannot use open circuit monitoring devices to monitor their effectiveness.

For instances in which the charged body is not continuously attached to ground, other types of monitors must be used. Fixed electric field meters of various types, revealed in, e.g. U.S. Pat. No. 4,562,429, have been used to watch for the presence of dangerous static electrical charge buildup in a work area. As an individual enters into the work area, fixed electric field meters can be used to establish if that individual is electrically charged to such an extent as to represent a hazard to the operations being conducted in the work area. Fixed electric field meters, while in operation, also require that there be a connection from the meter to electrical ground to establish a voltage reference. Therefor, a fixed field meter is not readily mobile and can only monitor a specific area around the meter. Unfortunately, a fixed field meter also has a limited coverage area and has no ability to distinguish the source of potentially damaging charge from among a number of possible sources. Fixed field meters thus have a limited usefulness in many applications, such as when several individuals are working in the same area or when the individuals are moving in areas beyond the coverage area of the meter.

The availability of a static electrical charge warning or monitoring device without an associated cord or tether connected to electrical ground would allow an electronics assembler to move freely around a work location. U.S. Pat. No. 5,461,369 describes a device that is worn by the user and does not require a grounding tether. The device of the '369 patent records the occurrence of an ESD event. The device includes a display element to provide immediate indication of a change in voltage associated with discharge of static electricity. One embodiment of the discharge indicator provides a device to be worn on a person's wrist, similar in size and appearance to a wristwatch. Another form of device appears as a ring to be worn on a person's finger. A third embodiment of the discharge indicator may be clipped to the wearer's clothing. In this case, a connecting wire must pass through the wearer's clothing to make direct contact with the wearer's skin. Although the device of the '369 patent allows a user to move freely without a grounding tether, each embodiment has the disadvantage of requiring direct contact between the device and the wearer. Without direct contact, there will be no record of an ESD event. Also, the device of the '369 patent only alerts a wearer after an ESD event has occurred. The device does not provide the ability to avoid the ESD and its accompanying damage.

As noted above, the monitoring devices such as those disclosed in U.S. Pat. Nos. 5,461,369 and 4,562,429 offer freedom of movement for users. However, they have limited ability to distinguish between an individual and a group of people or they only provide evidence of static electrical discharge after the discharge event occurs and are ill suited to prevent its occurrence. It would clearly be desirable to provide a device which can be worn by the user, and which does not need to be electrically connected to ground, thus providing the user freedom to move about the workplace. It would also be desirable to couple this mobility with the ability to warn a user of an impending ESD event, such that action may be taken to avoid the ESD. With suitable warning, a worker could take action to prevent the impending static electrical discharge from ever occurring, and thereby also prevent any damage that may be caused by such a discharge. Further, it would be desirable if the monitor only needs to be in close proximity of the user, without requiring direct electrical contact with the user.

SUMMARY OF THE INVENTION

The present invention provides a monitoring and warning device that functions when placed in close proximity to a potential source of static electrical charge. The device has no cord or tether connected to electrical ground, and thus movement may occur within a work area without restriction. The device does not require an ESD occurrence before alerting the user. Rather, the present invention monitors the voltage generated by tribocharging associated with normal motion of the user, and alerts the user when a dangerous level of static charge has accumulated. The user may then take action to dissipate the static charge in a controlled and non-damaging manner.

The static electrical charge sensor of the present invention comprises an enclosure for containment of an electrical circuit which measures the magnitude of a voltage difference between a first and second electrically conducting element. The first conducting element resides in attachment or close proximity to a suspected source of static electrical charge, while the second conducting element is spaced a fixed distance from the first conducting element. An electric field associated with the source of static electrical charge produces a voltage difference between the first conducting element and the second conducting element. The voltage difference is measured using a high impedance voltage discriminator with sufficient sensitivity to detect low-level tribocharging associated with routine bodily motion of an individual. Coupling the voltage discriminator with an alarm generating circuit produces a detectable warning when the magnitude of the static electrical charge exceeds a preset limit.

More specifically, the invention relates to a device for warning of the accumulation of static electrical charge exceeding a preset limit in the region of a source of static electrical charge. The device comprises a first conductive element in close proximity to the source of static electrical charge; at least a second conductive element, spatially fixed at a location more remote from the source of static electrical charge than the first conductive element; and a high impedance differential amplifier interposed between the first conductive element and the second conductive element to provide an output proportional to the potential difference existing between the first conductive element and the second conductive element. A voltage level discriminator receives the output from the high impedance differential amplifier and activates an alarm signal if the accumulation of static electrical charge exceeds a predetermined safe level.

DETAILED DESCRIPTION OF THE INVENTION

Electrostatic discharge (ESD) occurs when a sufficiently high static electrical charge accumulates on a surface with enough potential to flash across the narrowest available gap to a region of lower potential. When this path includes a sensitive electronic component, there is a high probability that the component will be damaged. In the absence of a path to ground, the accumulation of static charge produces an electric field that extends away from the statically charged surface. The present invention provides electric field sensing equipment that monitors the accumulation of a static charge and provides a warning before the field strength approaches a potentially damaging level prior to ESD.

As discussed above, event detectors that retain evidence of the occurrence of a static electrical discharge are known and are exemplified by U.S. Pat. No. 5,461,369. Such event detectors will respond to a voltage pulse of 15 to 25 volts which persists across an electronic device for about 15 nanoseconds. The electronic circuitry of the detector will convert this pulse to the signal needed for driving the display used to retain evidence of electrostatic discharge (ESD). While the ESD event exists for only tens of nanoseconds, the display retains evidence of the event long enough to be noted and recorded by the user.

Unfortunately, ESD measuring/detecting monitors of this type are ineffective for monitoring slowly increasing rates of static electrical charge build-up such as that which occurs through tribo-electrification. Such static charge build-up occurs relatively slowly with charge accumulation occurring over a longer time scale, measured at millisecond rather than nanosecond rates. The present invention provides a static electrical field detector which responds to slowly changing voltages (on the order of approximately 10 to 250 milliseconds), thereby allowing the present invention to detect small increases in static charge accumulation, such as those static charges caused by an individual walking, moving their arms or changing position in a chair. By measuring low levels of static electrical charge accumulation, the static charge monitor described herein allows a warning to be provided to a user when a static charge accumulation reaches a preset level of field strength. The warning allows the wearer of the detector to lower or eliminate static electrical charge from their body by, for example, establishing contact with a grounding cord or metal plate that will conduct accumulated charge to electrical ground prior to an uncontrolled ESD occurs.

Figure 1:
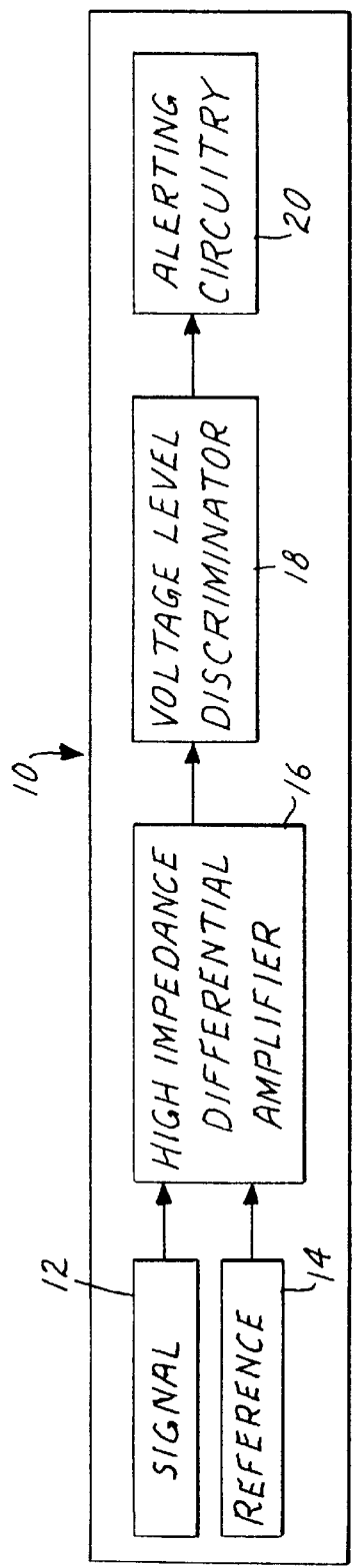
FIG. 1 is a block diagram of components used to sense the presence of a static electrical charge field and provide a warning of excessive amounts of static electrical charge.

FIG. 1 provides a block diagram of the inventive static electrical charge detection and warning device 10, illustrating the electrical components included in the device. Static electrical charge detection and warning device 10 includes a first conducting element 12 that provides an input signal. First conducting element 12 is preferably positioned in close proximity to the electrostatically charged body (not shown). A second conducting element 14 provides a reference signal and is spaced from first element 12 by a known distance. The input signal from first conducting element 12 is different from the reference signal associated with second conducting element 14 because the electric field of the charged body weakens with distance from the charged body. A high impedance differential amplifier 16 determines the voltage difference between the input signal and reference signal of elements 12, 14 and then connects to a voltage level discriminator 18 for processing to determine whether the voltage difference exceeds a preset level. If the voltage difference exceeds a preset level, alerting circuitry 20 is activated to warn the user of the static charge.

Figure 2:
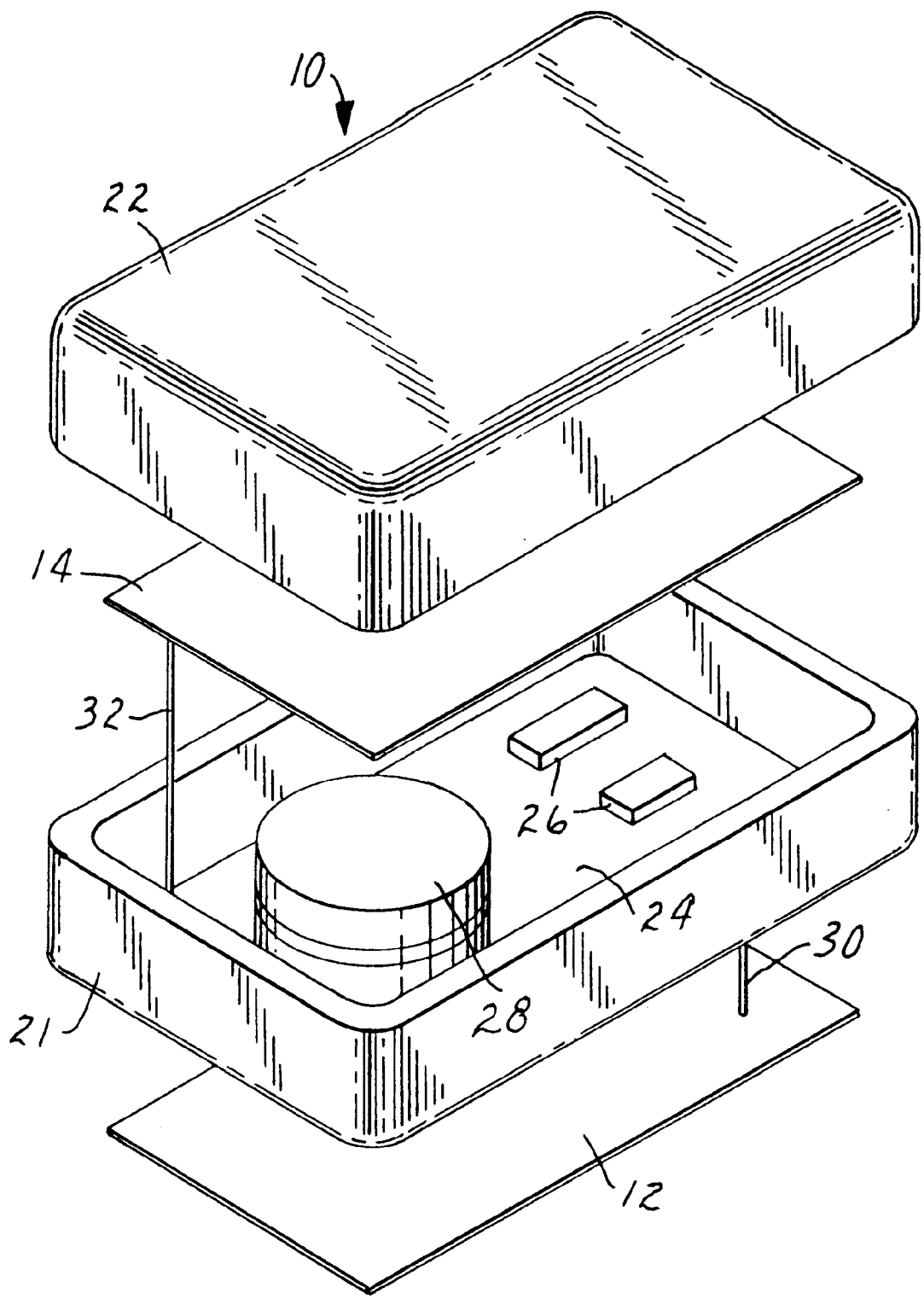
FIG. 2 is an exploded view of one possible embodiment of the inventive field warning device.

FIG. 2 shows one embodiment of the invention with its component parts in an exploded relationship. The static electrical charge detection and warning device 10 includes a housing 21 and a cover 22. The first conducting element 12, in the form of a metal plate antenna, abuts an outer surface of the housing 21. The second conducting element 14, also in the form of a metal plate antenna, fits inside the housing 21 and is in parallel relationship with the first element 12 and is spaced from first element 12 by a predetermined distance. Preferably conducting elements are spaced by a distance of about 0.5 cm to 5 cm. A printed circuit board 24, with its electronic assemblies 26 (including those which form high impedance differential amplifier 16, voltage level discriminator 18, and alerting circuitry 20), and an alarm mechanism 28 are positioned between the second conducting element 14 and first conducting element 12. Alarm mechanism 28 may be any suitable time of alarm, such as an audible alarm, a tactile alarm, or a visual alarm. Alternatively, the alarm mechanism 28 may communicate with a remote unit for logging the activity of the static electric charge field sensing device. In this case the logged signal may be encoded ultrasonic, infrared or radio frequency energy including a code to identify a specific monitor and record information of its status. Conducting elements 12, 14 are electrically connected to circuit board 24 via electrical connections 30, 32, respectively. Application of the cover 22 to the housing 21 provides an enclosure around the printed circuit board 24, alarm 28 and the second conducting element 14, leaving the first conducting element 12 exposed on the outer surface of the housing 21.

Figure 4:
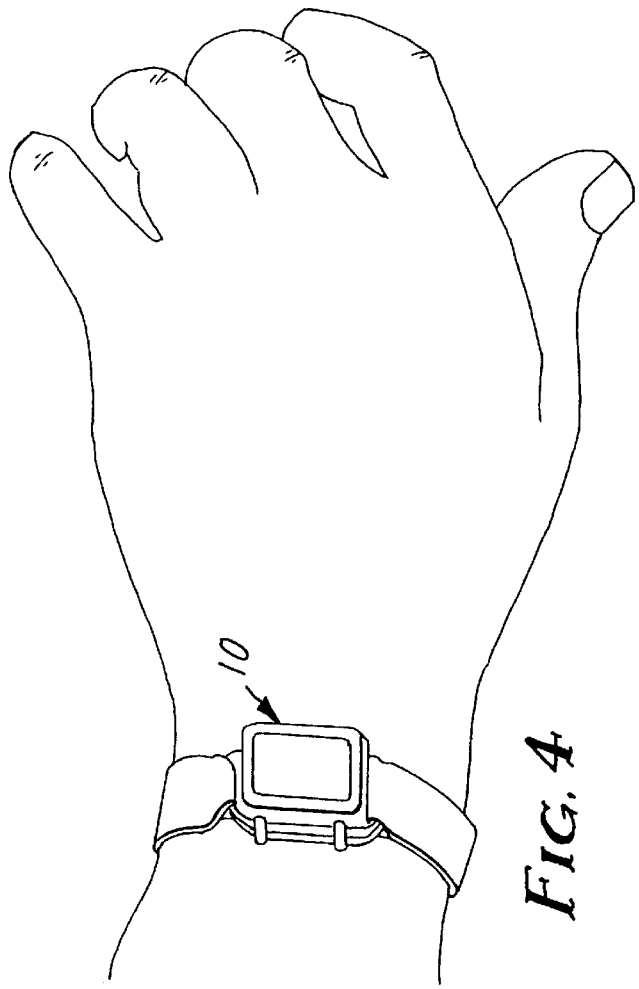
FIG. 4 illustrates attachment of a warning device to the wrist of an assembler.
Figure 3:
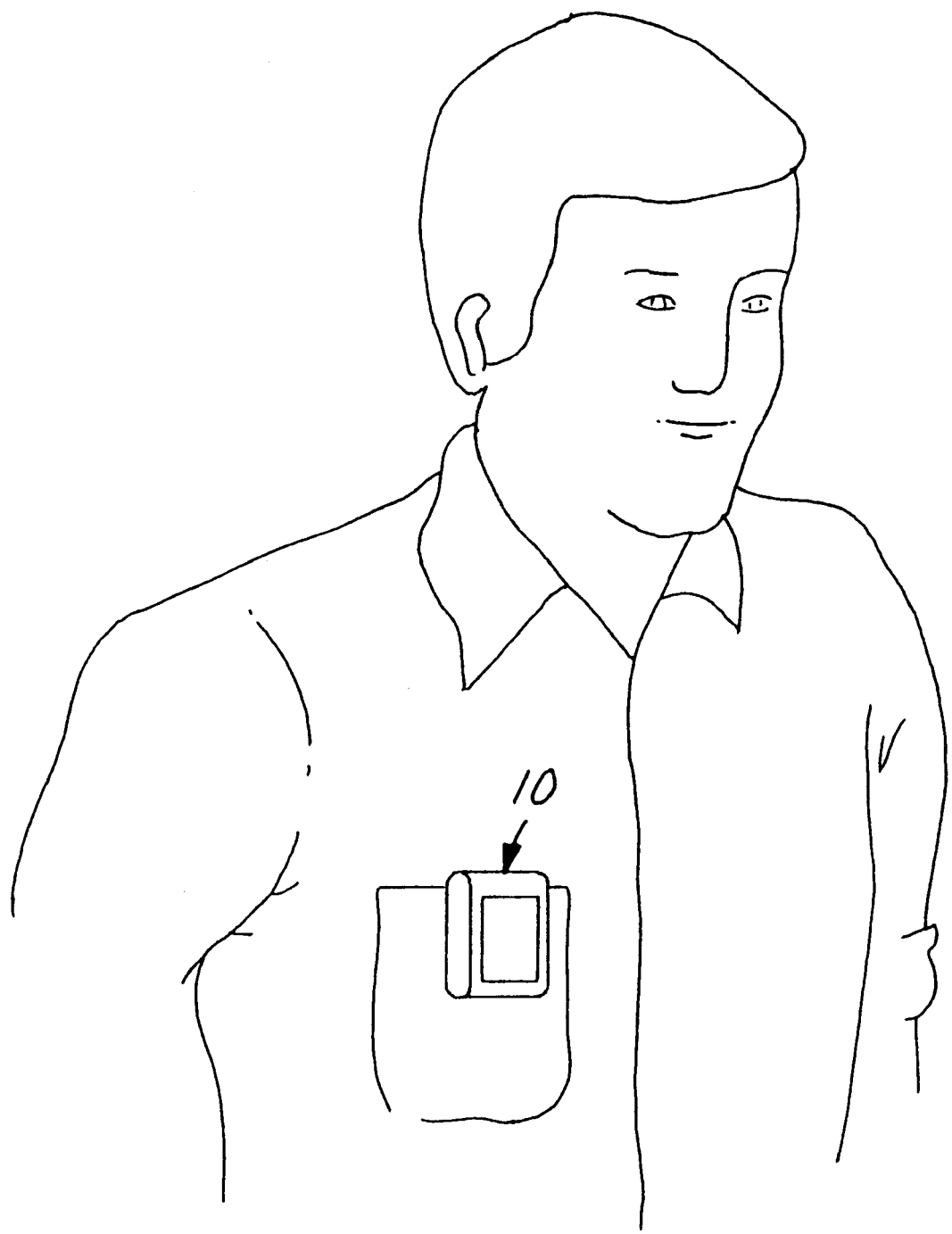
FIG. 3 is an illustration of the attachment of a warning device to the body of an assembler.

In the embodiment of FIG. 2, the static electrical charge detector and warning device 10 of the present invention is approximately the size of a pager or smaller. One side of the device 10 with first conducting element 12 must reside in close proximity with the surface of the user's body. It is not necessary, however, that the conducting element 12 makes actual contact with the wearer's body. For example, as shown in FIG. 3 the device 10 may be worn by, e.g. attachment to a belt, clipped to a pocket or carried inside a pocket. Of course, the conducting element 12 may make contact with a wearer's skin, such as, e.g. part of a wrist bracelet or a finger ring as shown in FIG. 4. However, direct contact with the user's skin is not necessary for effective operation of the device. Regardless of the level of contact with the wearer, the device 10 monitors the accumulation of static electrical charge generated by tribo-electrification as the individual wearing the device conducts normal work activities. Under normal circumstances, the detector will experience the same level of static electrical charge, no matter where it is located on the body. This condition exists because, being a good conductor, the human body carries an equal distribution of surface charge intensity.

During operation, the conducting elements 12, 14 function as antenna surfaces, suitably positioned to probe the electric field associated with increasing accumulation of static electrical charge on the body of the wearer. The first conducting element 12, if not in direct contact with the wearer, is closely capacitively coupled to the body of the person being monitored. The second conducting element 14 is capacitively coupled to the user's environment, but is not directly connected to electrical ground. As the person being monitored moves, electrical charge will be generated by tribo-electrification. If the charge is not removed by grounding, a voltage with respect to ground will be generated on the body of the person, and an electrical field will be developed which surrounds the body. The electrical field strength dissipates as the distance from the body increases. The difference in spatial relationship between the charged surface of the user's body and the separated conducting elements 12, 14 produces different electrical potentials in the region of each element 12, 14. This results in a measurable voltage difference between the first conducting element 12 and the second conducting element 14 as measured by a high impedance differential amplifier 16 positioned between elements 12, 14. Amplifier 16 has a circuitry design that provides sufficient input impedance and gain for reliable response to the voltage differences produced between the two conductive elements 12, 14 by the tribocharging that occurs on the time scale of normal human motions.

Figure 5:
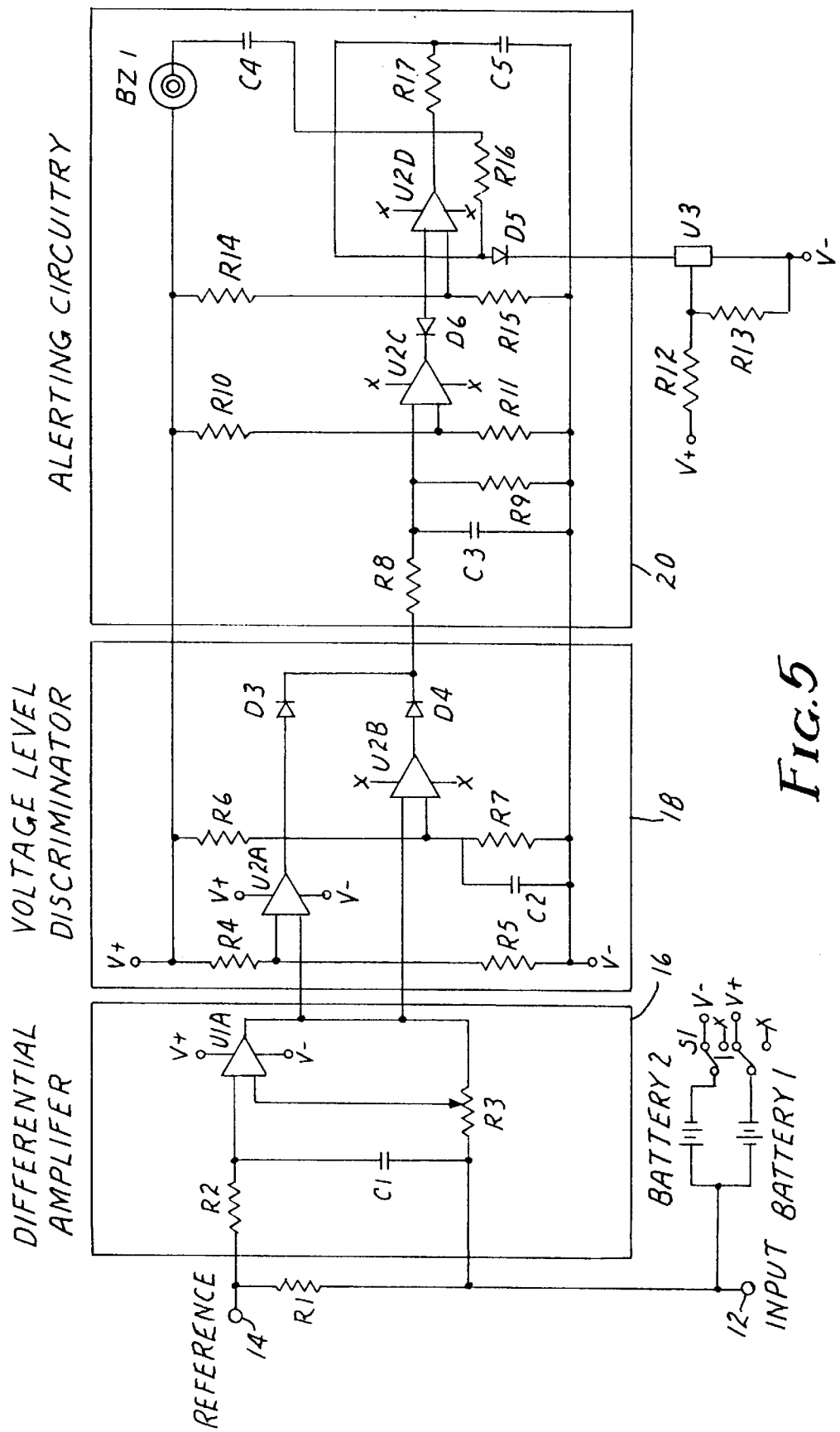
FIG. 5 is an electrical schematic for an embodiment of the warning device.

The circuit schematic of FIG. 5 provides further detail of the warning device 10. In this case, the reference signal, detected by the second conducting element 14, is fed to amplifier U1A through resistor R2. Resistor R2, in combination with capacitor C1, functions to filter AC noise from the signals. The input signal, detected by the first conducting element 12, is fed to amplifier U1A through variable resistor R3. The use of variable resistor R3 allows the gain of differential amplifier 16 to be varied, such that the sensitivity of the device 10 can be adjusted by the user. Resistor R1 is a high value resistor which allows a slow leakage of current between the input signal and the reference signal. This leakage is used to reset the detector after a field change occurs.

The output of amplifier U1A is applied to the inputs of voltage discriminator 18, which uses amplifiers U2A and U2B as negative and positive voltage level discriminators, respectively. Resistors R4, R5, R6, and R7 form voltage divider circuits that set the discrimination limits. Capacitor C2 is provided to hold the reference voltage of U2B low for a short period of time upon initial power-up of the device, thereby causing the alerting circuitry 20 to provide a short "beep" (or other chosen alarm) to indicate the device is operational. When combined with a precision voltage detector U3 and its associated circuitry (resistors R12, R13 and diode D5), this feature can also alert the user to a low battery condition. That is, if the battery voltage is lower than a limit that is determined by resistors R12 and R13, then U1 will be held low and will not allow the oscillator of the alerting circuit 20 to run free, thereby preventing the "beep" (or other chosen alarm) from activating on power-up of the device 10.

The presence of a low battery indicator is especially helpful, because failure of device 10 could result in damaging ESD events. The electronics of device 10 are preferably designed to minimize the current draw on the batteries which power device 10. The energy, in the form of electrical current, which is available from a battery is related to its size and weight. It is desirable to use small batteries such as coin cells to keep the sized and weight of device 10 low for easy portability. This requires that the current consumption of the electronics be low enough to obtain an operating time that is long enough for practical use of such batteries. For this reason, circuit components are preferably chosen so that device 10 draws less than 150 microamps when the buzzer is not sounding. Using two typical 3 volt lithium coin cell batteries, this allows the device to operate continuously for approximately three months.

When either the positive or negative voltage limit is exceeded in voltage level discriminator 18, the output of amplifier U2C goes high, causing amplifier U2D to oscillate and drive the buzzer (or other chosen alarm). Resistors R8, R9, R10, R11 and capacitor C3 are provided to create a delay circuit that lengthens the time the alarm activates for short-lived alert conditions.

In some instances, a voltage difference may be detected by the embodiment of FIG. 5, even though the user is grounded or has no static charge, thereby resulting in a false alarm. This is most likely to occur when the housing 21 itself becomes tribocharged, such as when the device 10 rubs on the clothing of the user when carried in a shirt pocket.

Figure 6:
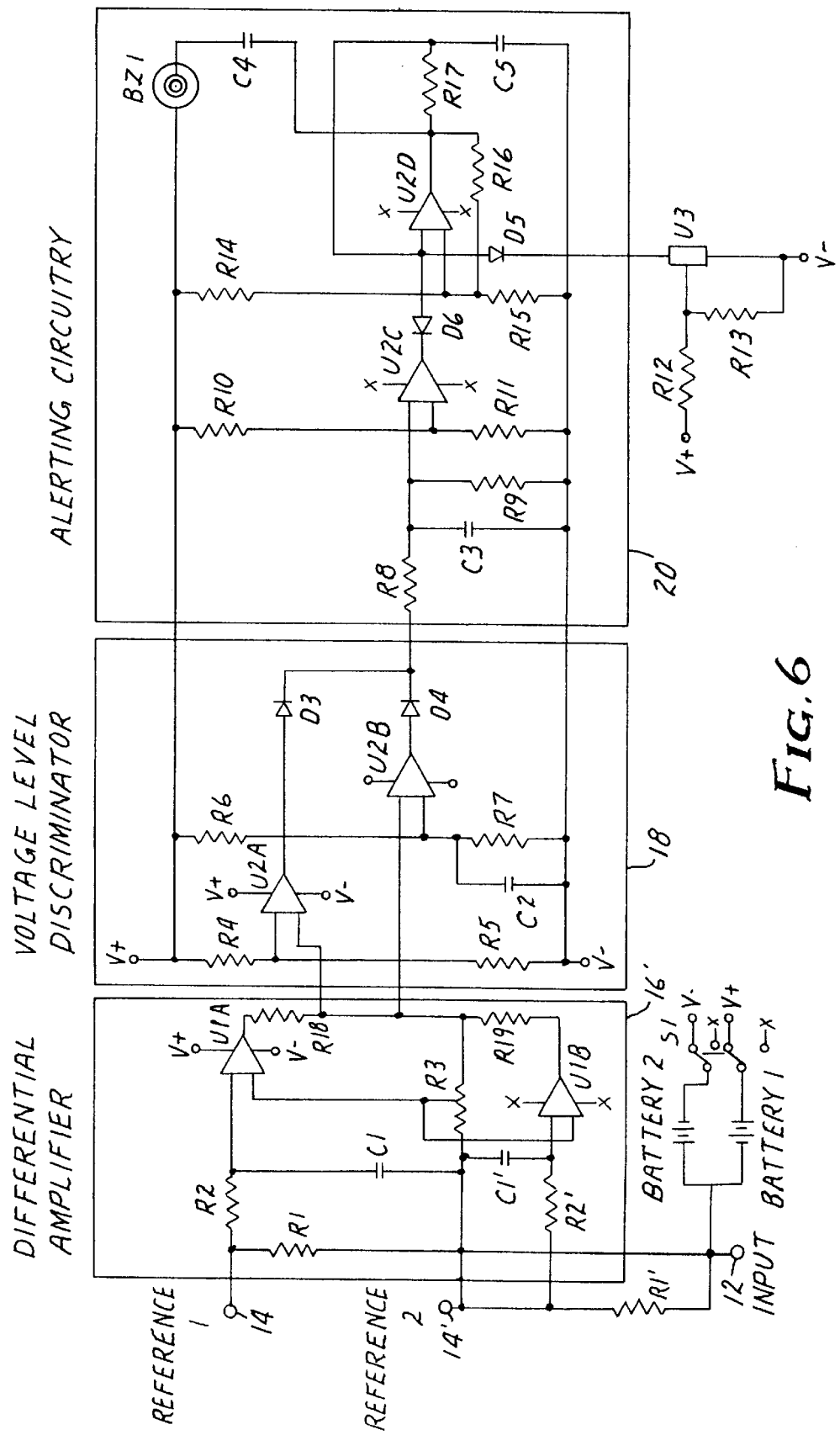
FIG. 6 is an electrical schematic for an alternate embodiment of the warning device.

FIG. 6 provides a circuit schematic of an alternative embodiment of the invention which may be used to discriminate between tribocharging of housing 21 and tribocharging of the user. The embodiment of FIG. 6 is similar to that shown in FIG. 5, (the voltage level discriminator 18 and alerting circuitry 20 are identical) and like components have been provided with like reference characters. In the embodiment of FIG. 6, a third conducting element 14' has been added, so that two reference signals, rather than one, are provided to the differential amplifier 16'. The second conducting element 14 of FIG. 2 has effectively been divided to create third conducting element 14'. Both second and third conducting elements 14, 14' are metal plate antennas located within housing 21, in parallel relationship to first conducting element 12 and spaced from first conducting element 12 by a predetermined distance. The differential amplifier circuitry is configured so the signal on both conducting elements 14, 14' must be similar for the device 10 to alert. Because second and third conducting elements 14, 14' are separated in location in housing 21, it is unlikely that both elements 14, 14' will be identically affected by tribocharging of housing 21, thereby limiting this condition as a cause of alerts. However, electric fields caused by voltage changes on the body of the wearer will affect both elements 14, 14' equally and will cause alerts if the voltage limits are exceeded.

The differential amplifier 16' of FIG. 6 is constructed in a manner similar to the differential amplifier 16 of FIG. 5. Specifically, the first reference signal, detected by second conducting element 14, is fed to amplifier U1A through resistor R2. Resistor R2, in combination with capacitor C1, functions to filter AC noise from the first reference signal. The second reference signal, detected by third conducting element 14', is fed to amplifier U1B through resistor R2'. Resistor R2', in combination with capacitor C1', functions to filter AC noise from the second reference signal. The input signal, detected by the first conducting element 12, is fed to amplifiers U1A and U1B through variable resistor R3. The use of variable resistor R3 allows the gain of differential amplifier 16' to be varied, such that the sensitivity of the device 10 can be adjusted by the user. Resistors R1 and R1' are high value resistors which allows a slow leakage of current between the input signal and the reference signals. This leakage is used to reset the detector after a field change occurs. Resistors R18 and R19 are used to limit the output current of amplifiers U1A and U1B, and have values that are small compared to resistor R3. In this configuration, the reference inputs of both amplifiers must be similar for a significant voltage to appear at the combining point for their output. The output of differential amplifier 16' is fed to voltage level discriminator 18, which functions in the manner described above with reference to FIG. 5.

For the embodiments shown in FIGS. 5 and 6, the voltage difference between the input signal and the reference signal (s) is proportional to the voltage with respect to ground on the person. As noted above, the voltage at the input signal (first conducting element 12) is not referenced to ground, but rather is referenced to the potential input (second conducting elements 14, 14'). Because the conducting elements 12, 14, 14' are capacitively coupled to the charged body of the user and the user's environment, respectively, the voltage seen by the device 10 is reduced by capacitive division by a factor that is approximately the ratio of the capacitance to ground from the reference input (conducting elements 14, 14') and the input capacitance of the device. In the case of the examples described above, the input capacitance is approximately equal to the capacitance of capacitor C1 (on the order of 500 pF) for conducting element 12, and the capacitance to ground of the reference inputs (conductive elements 14, 14') is approximately 1 pF. The capacitance to ground of the reference inputs is based on a 15 $cm^2$ thin metal plate located about 1 cm from the wearer's body. As will be recognized by those skilled in the art, the capacitance is a function of the device design and are affected by factors such as the size of the conductive elements 12, 14, 14' and the distance of elements 12, 14, 14' from the wearer. The capacitance between the reference input and ground varies as the relationship between the person and the objects in his environments varies. Therefore, there will be some variability in the factor that relates the voltage to ground on the person to the voltage that is sensed by the monitor. This variability, however, may be minimized by careful design of the device and knowledge of how the device will be used.

It can be seen that the invention described herein provides a voltage level discriminator used to determine if the existing static charge condition creates a voltage which exceeds a predetermined safe level. In the presence of voltage beyond the predetermined safe level, the device activates an alarm which alerts the user to the dangerous condition. Although this invention has been described with reference to specific embodiments, this description is not to be construed in a limiting sense. For example, those skilled in the art will recognize modifications and alterations which may be made to the embodiments illustrated herein. However, it is contemplated that such modifications can be made without departing from the scope and spirit of the invention as defined in the claims.

What is claimed is:

1. A pre-discharge monitor for sensing the intensity of a changing electric field, extending from a source of static electrical charge, and alerting a user when said electrical field exceeds a preset limit, said pre-discharge monitor comprising:

a first conductive element in close proximity, without direct contact, to said source of static electrical charge;

a second conductive element, spatially fixed at a location further from said source of static electrical charge than said first conductive element;

a high impedance differential amplifier, interposed between said first conductive element and said second conductive element to provide a voltage signal proportional to said potential difference existing between said first conductive element and said second conductive element;

a voltage level discriminator for receiving said voltage signal from said high impedance differential amplifier, said voltage level discriminator adapted to provide an alerting signal if said voltage signal exceeds a predetermined limit;

an alerting circuit for receiving said alerting signal, said alerting circuit adapted to activate an alarm mechanism in the presence of said alerting signal to indicate that the electrical field has exceeded the preset limit; and wherein said device responds to voltage changes which occur over the range of 10 to 250 milliseconds.

2. The device of claim 1, wherein the device is wearable by the user.

3. The device of claim 2, wherein said first and second conductive elements are not connected to electrical ground.

4. The device of claim 1, wherein said first and second conductive elements are formed from plates of metal foil.

5. The device of claim 2, where in the device is powered by batteries.

6. The device of claim 5, further comprising a low battery indicator.

7. The device of claim 2, wherein said alerting signal is an audible alarm.

8. The device of claim 2, wherein said alerting signal is a tactile alarm.

9. The device of claim 2, wherein said alerting signal is an encoded signal.

10. A pre-discharge monitor for sensing the intensity of a changing electric field, extending from a source of static electrical charge, and alerting a user when said electrical field exceeds a preset limit, said pre-discharge monitor comprising:

a first conductive element in close proximity, without direct contact, to said source of static electrical charge;

a second conductive element, spatially fixed at a location further from said source of static electrical charge than said first conductive element;

a third conductive element, spatially fixed at a location further from said source of static electrical charge than said first conductive element;

a high impedance differential amplifier, interposed between said first conductive element and said second and third conductive elements to provide a voltage signal proportional to said potential difference existing between said first conductive element and said second and third conductive elements;

a voltage level discriminator for receiving said voltage signal from said high impedance differential amplifier, said voltage level discriminator adapted to provide an alerting signal if said voltage signal exceeds a predetermined limit; and an alerting circuit for receiving said alerting signal, said alerting circuit adapted to activate an alarm mechanism in the presence of said alerting signal to indicate that the electrical field has exceeded the preset limit.

11. The device of claim 10, wherein said third conductive element is spatially separated from said second conductive element, and wherein said second and third conductive elements are located equidistant from said source of static electrical charge.

* * * * *